(12) United States Patent
Zhang et al.

(10) Patent No.: US 11,056,413 B2
(45) Date of Patent: Jul. 6, 2021

(54) COMBINED INDUCTOR AND HEAT TRANSFER DEVICE

(71) Applicant: International Business Machines Corporation, Armonk, NY (US)

(72) Inventors: Xin Zhang, Yorktown Heights, NY (US); Todd Takken, Brewster, NY (US); Shurong Tian, Mount Kisco, NY (US); Yuan Yao, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/417,845

(22) Filed: May 21, 2019

(65) Prior Publication Data
US 2020/0373217 A1   Nov. 26, 2020

(51) Int. Cl.
*H01L 49/02* (2006.01)
*H01L 23/64* (2006.01)
*H01L 23/367* (2006.01)

(52) U.S. Cl.
CPC .......... *H01L 23/367* (2013.01); *H01L 23/645* (2013.01); *H01L 28/10* (2013.01)

(58) Field of Classification Search
CPC ...... H01L 23/367; H01L 23/645; H01L 28/10
See application file for complete search history.

(56) References Cited

U.S. PATENT DOCUMENTS

| 2012/0056703 | A1* | 3/2012 | Ikriannikov | H01F 27/292 336/105 |
| 2013/0201645 | A1* | 8/2013 | Catalano | H01F 27/306 361/782 |
| 2013/0207763 | A1* | 8/2013 | Wagoner | H01F 27/08 336/60 |
| 2015/0371756 | A1* | 12/2015 | Sturcken | H01F 41/046 336/200 |
| 2016/0064470 | A1* | 3/2016 | Mihailovich | H01F 17/0013 257/531 |
| 2017/0053728 | A1* | 2/2017 | Mehrotra | H01F 41/0233 |

FOREIGN PATENT DOCUMENTS

| CN | 108990362 A | 12/2018 |
| EP | 2 797 090 A1 | 10/2014 |
| EP | 1 756 935 B1 | 9/2016 |
| WO | 2010149673 A1 | 12/2010 |

* cited by examiner

*Primary Examiner* — Stephen M Bradley
*Assistant Examiner* — Gustavo G Ramallo
(74) *Attorney, Agent, or Firm* — Harrington & Smith

(57) ABSTRACT

An inductor includes a conductor having a first end and a second end, wherein the first end, the second end, or both ends are configured to be mounted on a substrate and configured to receive a heat flow; and one or more magnetic cores surrounding a first portion of the conductor, the first portion of the conductor being intermediate the first end and the second end of the conductor. A second portion of the conductor not surrounded by the one or more magnetic cores is configured to transfer the heat flow from the conductor.

20 Claims, 11 Drawing Sheets

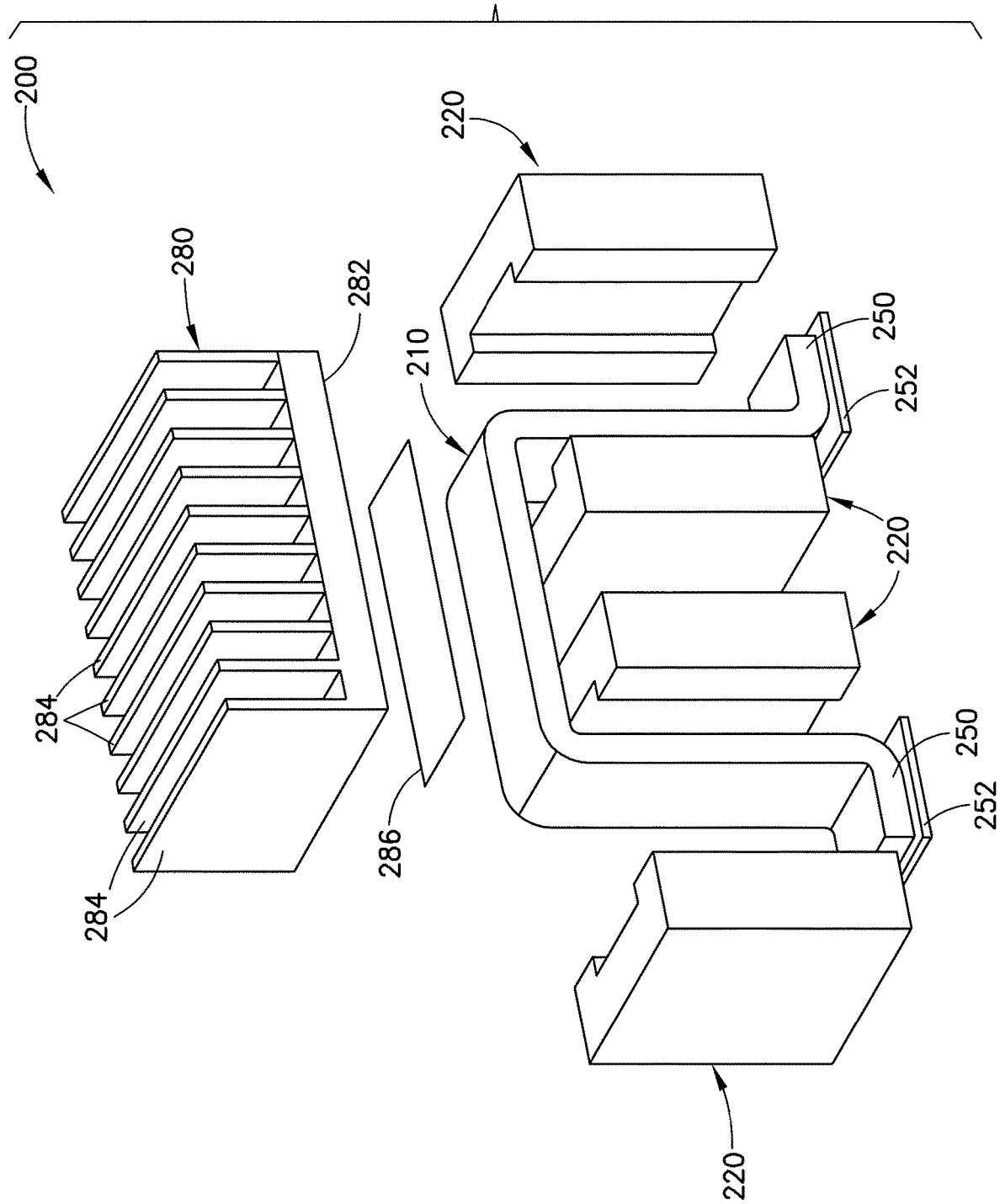

US 11,056,413 B2

COMBINED INDUCTOR AND HEAT TRANSFER DEVICE

STATEMENT REGARDING FEDERALLY SPONSORED RESEARCH OR DEVELOPMENT

This invention was made with Government support under Contract No.: B621073 awarded by Department of Energy. The Government has certain rights in this invention.

BACKGROUND

The exemplary embodiments described herein relate generally to semiconductor structures and, more specifically, to the use of inductors to improve heat dissipation in semiconductor devices.

Various electrical components, such as semiconductor devices, on a circuit board generate heat. It is desirable to remove heat in order to maintain the temperatures of the components within their respective functional operating ranges. Conventional methods of cooling generally remove heat from the components directly through heat conducting elements such as heat sinks or heat spreaders that are kept in contact with the components. However, it is often difficult to obtain direct contact with smaller components on the circuit board. Air cooling techniques may be used in some circumstances, but such techniques may have limited efficacy with regard to cooling components having shorter profiles. Thus, both heat sinks and air cooling techniques may be limited in their abilities to effectively remove heat from the components as well as from the surface of the circuit board itself.

BRIEF SUMMARY

In accordance with one aspect, an inductor comprises a conductor having a first end and a second end, wherein the first end, the second end, or both ends are configured to be mounted on a substrate and configured to receive a heat flow; and one or more magnetic cores surrounding a first portion of the conductor, the first portion of the conductor being intermediate the first end and the second end of the conductor. A second portion of the conductor not surrounded by the one or more magnetic cores is configured to transfer the heat flow from the conductor.

In accordance with another aspect, an inductor comprises a conductive winding, the conductive winding comprising an elongated member having a first end and a second end through which electrical current can flow; and one or more magnetic cores enclosing a portion of the conductive winding. A portion of the conductive winding not enclosed by the one or more magnetic cores is configured to conduct heat away from the conductive winding.

In accordance with another aspect, a method comprises providing a conductor through a magnetic core, the conductor having a first end and a second end, the first end and the second end configured to be mounted on a substrate, and the magnetic core surrounding a first portion of the conductor, the first portion of the conductor being intermediate the first end and the second end of the conductor; conducting current through the conductor with an inductance created by a current loop and the magnetic core; conducting heat to the conductor; and transferring the heat away from the conductor.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIG. 2A is an exploded perspective view of an inductor having four magnetic cores and a heat sink;

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1A:
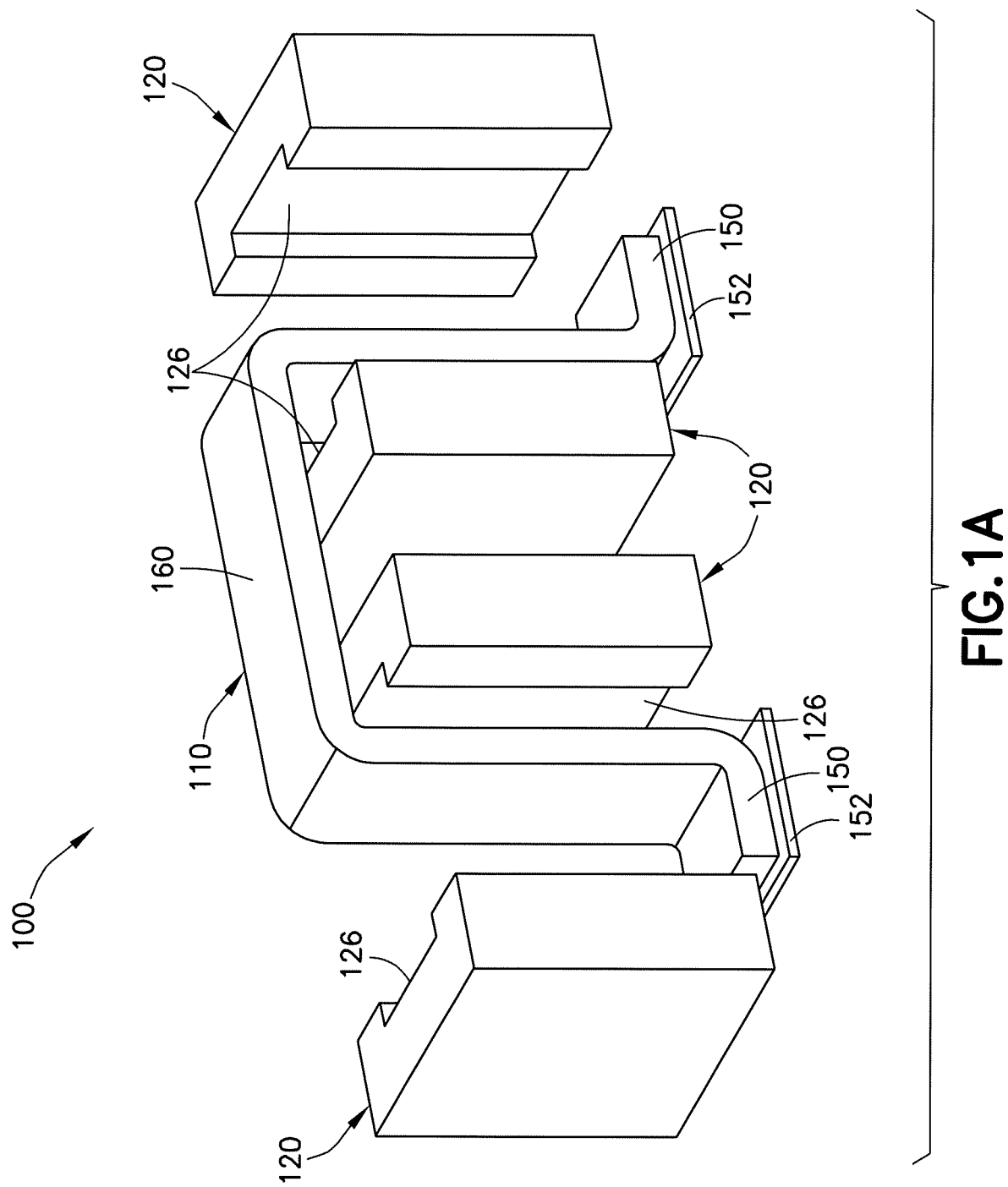
FIG. 1A is an exploded perspective view of an inductor having four magnetic cores.
Figure 1B:
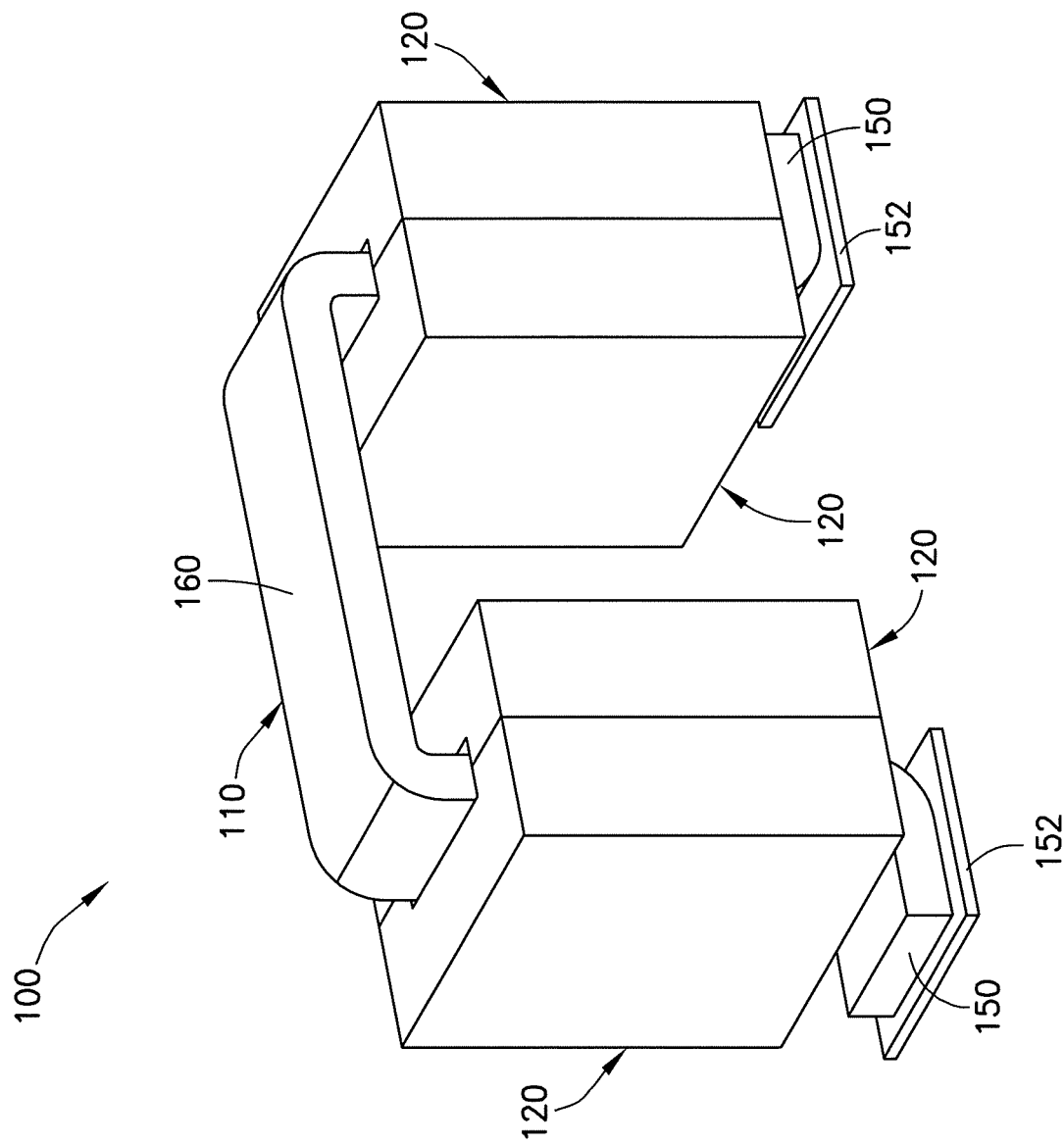
FIG. 1B is a perspective view of the inductor of FIG. 1A showing the magnetic cores closed around a conductor.
Figure 1C:
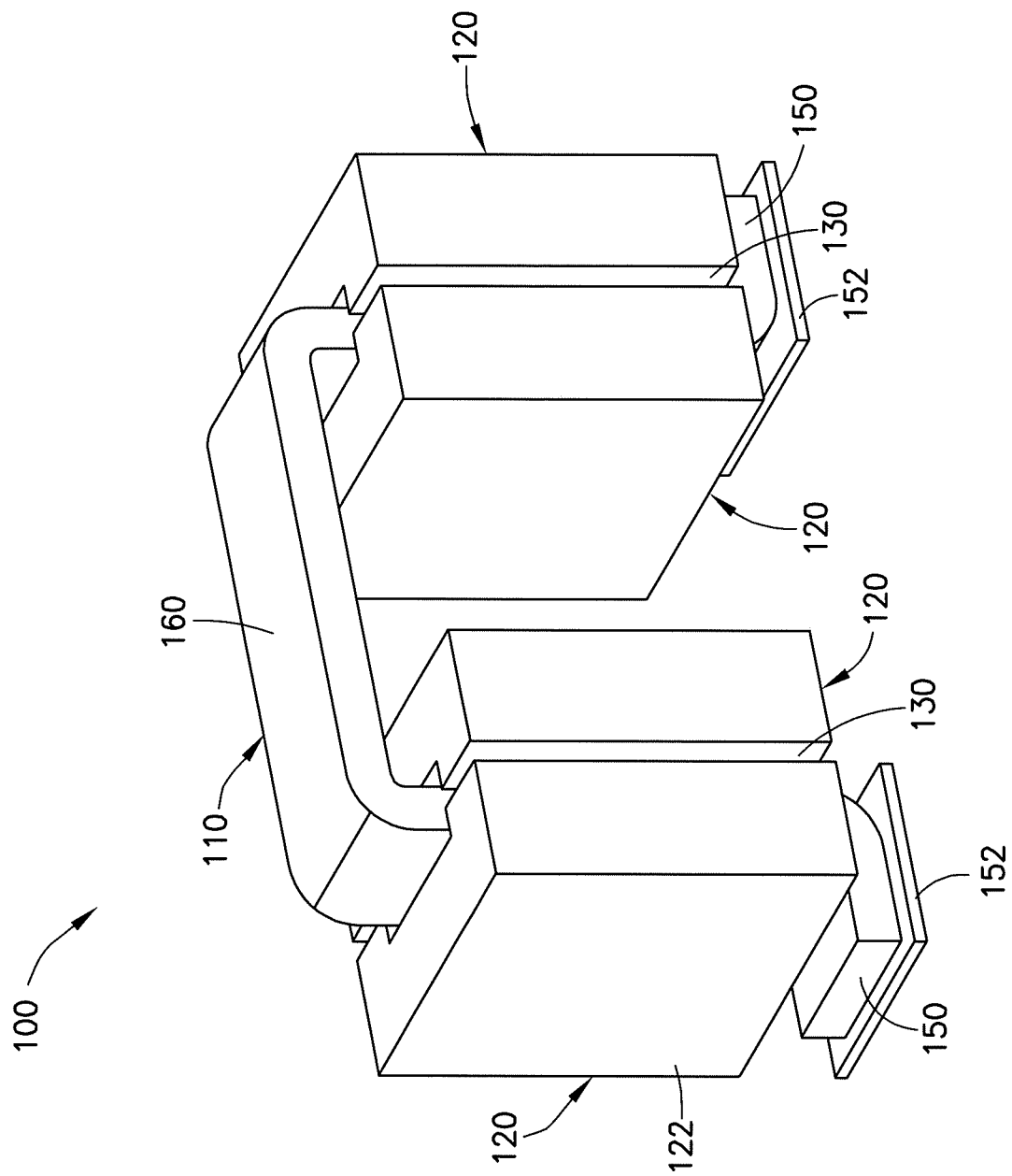
FIG. 1C is a perspective view of the inductor of FIG. 1A in which the magnetic cores, when coupled to the conductor, include longitudinal gaps.

Referring to FIGS. 1A-1C, one exemplary embodiment of an inductor structure having improved thermal conductivity suitable for use as a path for transferring heat from semiconductors devices or other circuit board components is shown generally at 100 and is hereinafter referred to as "inductor 100." Inductor 100 comprises a conductor 110 around which one or more magnetic cores 120 are mounted, with four magnetic cores 120 being shown in the Figures. The conductor 110 operates as a winding for the inductor 100. At least two magnetic cores 120 are disposed around the conductor 110 to provide a path for magnetic flux. Each magnetic core 120 is generally a ferrite material having high magnetic permeability and low electrical conductivity. Ferrite materials that may be used to form the magnetic core 120 are generally iron oxides combined with manganese, zinc, and/or nickel, although other materials may be used. In embodiments in which two or more magnetic cores 120 are used, the magnetic cores may include different materials. Additionally, in embodiments in which two or more magnetic cores 120 are used, the magnetic cores may be of different sizes.

As shown in FIG. 1A, each of the magnetic cores 120 may include a recess 126 or other type of recessed portion that extends from one end to an opposing end such that when two magnetic cores 120 are coupled together, non-magnetic openings are formed at opposing ends of the assembled magnetic cores 120. As shown in FIG. 1B, each recess 126 is configured to accommodate the conductor 110 when the magnetic cores 120 are closed around the conductor 110. As shown in FIG. 1C, each of the magnetic cores 120 may be coupled around the conductor 110 so as to form gaps 130 extending lengthwise along the magnetic cores 120. The gaps 130 may help to mitigate magnetic flux saturation in the inductor 100. In addition, because the width of each of gap 130 is very small, the magnetic field leakage of the gaps is negligible. As shown in FIG. 1B, the width of each gap 130 may be reduced to zero to form a completely closed magnetic loop thereby maximizing inductance and the Q value of the inductor 100. In some embodiments, only one of the two magnetic cores 120 assembled around the conductor 110 may include the recess 126.

The conductor 110 may be formed from one metal piece, for example, by a stamping operation. As shown, the end portions of the conductor 110 are bent so as to define two feet 150 located at a bottom (board) side such that the conductor extends from a first of the two feet 150 through a first of the magnetic cores 120, through a turn in a substantially perpendicular direction to extend along an upper length 160, through a second turn to extend in another substantially perpendicular direction and substantially parallel to the extension of the conductor 110 through a first assembly of the magnetic cores 120 and through a second assembly of the magnetic cores 120, and to the second of the two feet 150. The upper length 160 provides a substantially planar surface. The material of the conductor 110 extends beyond the magnetic core region such that inner surfaces of the magnetic cores 120 allow thermal contact to be made with the conductor 110. When assembled with magnetic cores 120, the feet 150 are mounted to a circuit board or other substrate (for example, by soldering to conductive pads 152 or the like). A connection of the feet 150 to the circuit board may provide a path through which the inductor 100 is driven or otherwise powered, for example, by the flow of electric current.

Figure 2B:
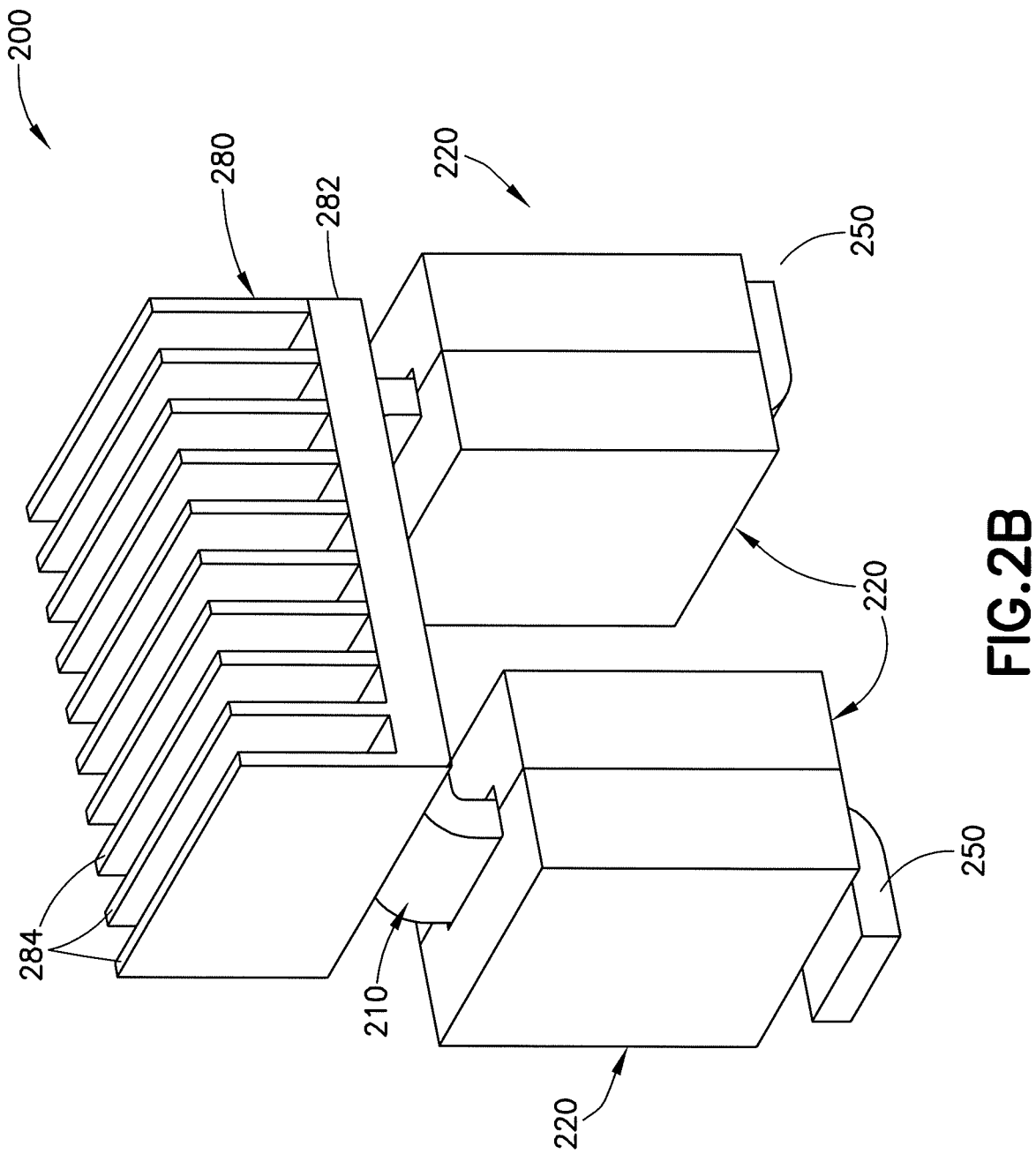
FIG. 2B is a perspective view of the inductor of FIG. 2A showing the magnetic cores closed around the conductor and the heat sink positioned on the conductor.
Figure 2C:
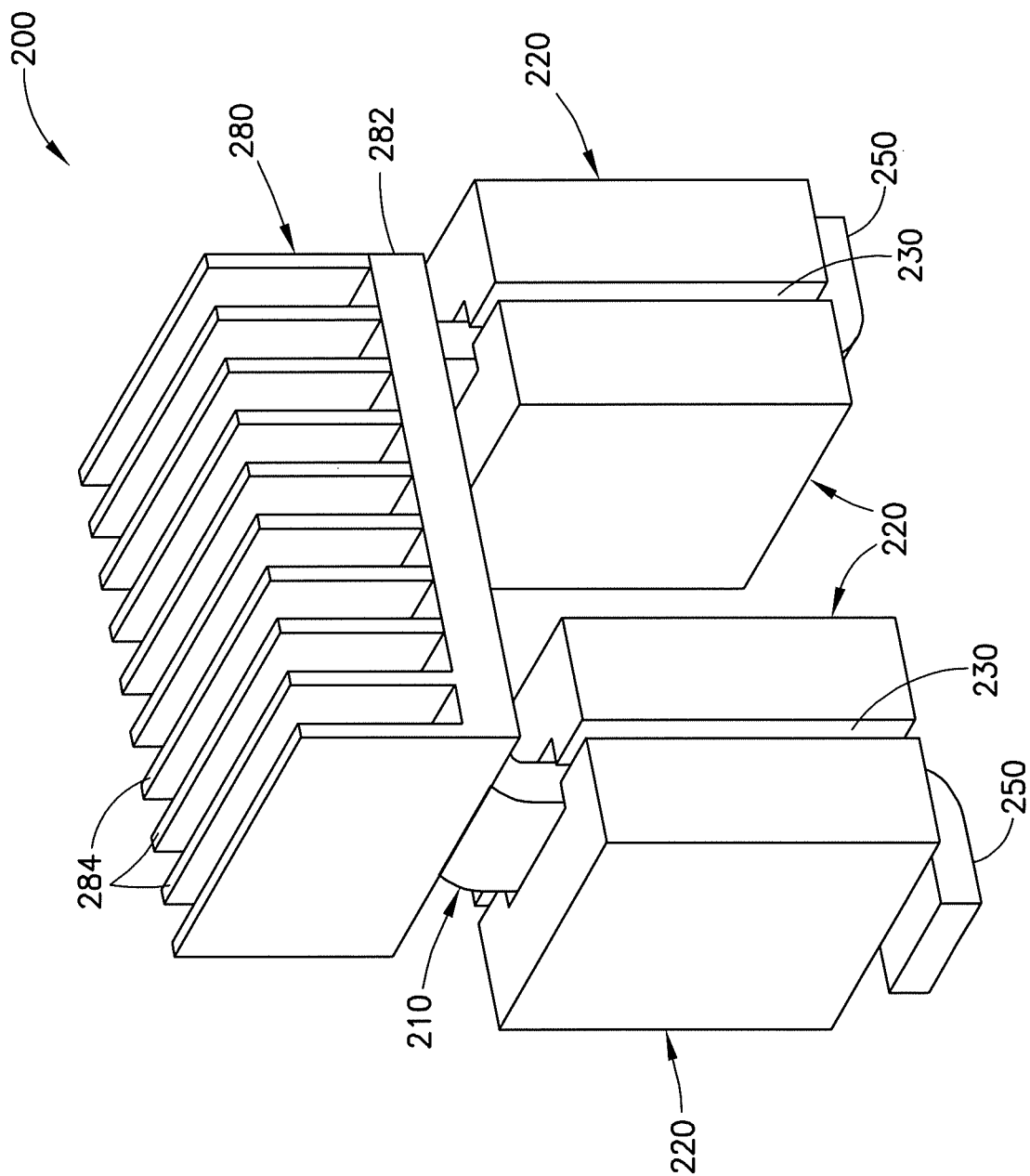
FIG. 2C is a perspective view of the inductor of FIG. 2A in which the magnetic cores, when coupled to the conductor, include longitudinal gaps.

Referring to FIGS. 2A-2C, another exemplary embodiment of an inductor structure having improved thermal conductivity is shown generally at 200 and is hereinafter referred to as "inductor 200." Inductor 200 is similar to inductor 100 and includes a conductor 210 and magnetic core(s) 220, but inductor 200 includes a cooling element in the form of a heat sink 280 for dispersing heat from (1) the conductor 210, (2) semiconductors devices or other circuit board components proximate the inductor 200, and/or (3) a circuit board or other substrate onto which the inductor 200 is mounted (e.g., by soldering or the like). The conductor 210 may have feet 250 that are mounted on pads 252.

As shown in FIG. 2A, the heat sink 280 comprises a base 282, which may be a substantially planar element, having a plurality of fins 284 extending substantially perpendicularly from an upper surface of the base 282, with a lower surface of the base 282 being in contact with the conductor 210 through a thermal interface material 286. In some exemplary embodiments, the heat sink 280 may be fabricated of metal, such as aluminum, copper, or any other suitable metal or alloy and may be coupled to the conductor 210 through the thermal interface material 286 or formed as an integrated unit with the conductor 210. The thermal interface material 286 may comprise any suitable material capable of facilitating effective thermal contact between the heat sink 280 and the conductor 210. In some exemplary embodiments, the thermal interface material 286 may comprise an adhesive or tape.

As shown in FIG. 2B, the heat sink 280 is mounted on a portion of the conductor 210 exposed outside the magnetic region. As shown, the portion of the conductor 210 exposed outside the magnetic region is intermediate the magnetic cores 220. As shown in FIG. 2C, two magnetic cores 220 may be coupled around the conductor 210 so as to form gaps 230 extending lengthwise along the magnetic cores 220. The gaps 230 may help to mitigate magnetic flux saturation in the inductor 200.

Figure 3A:
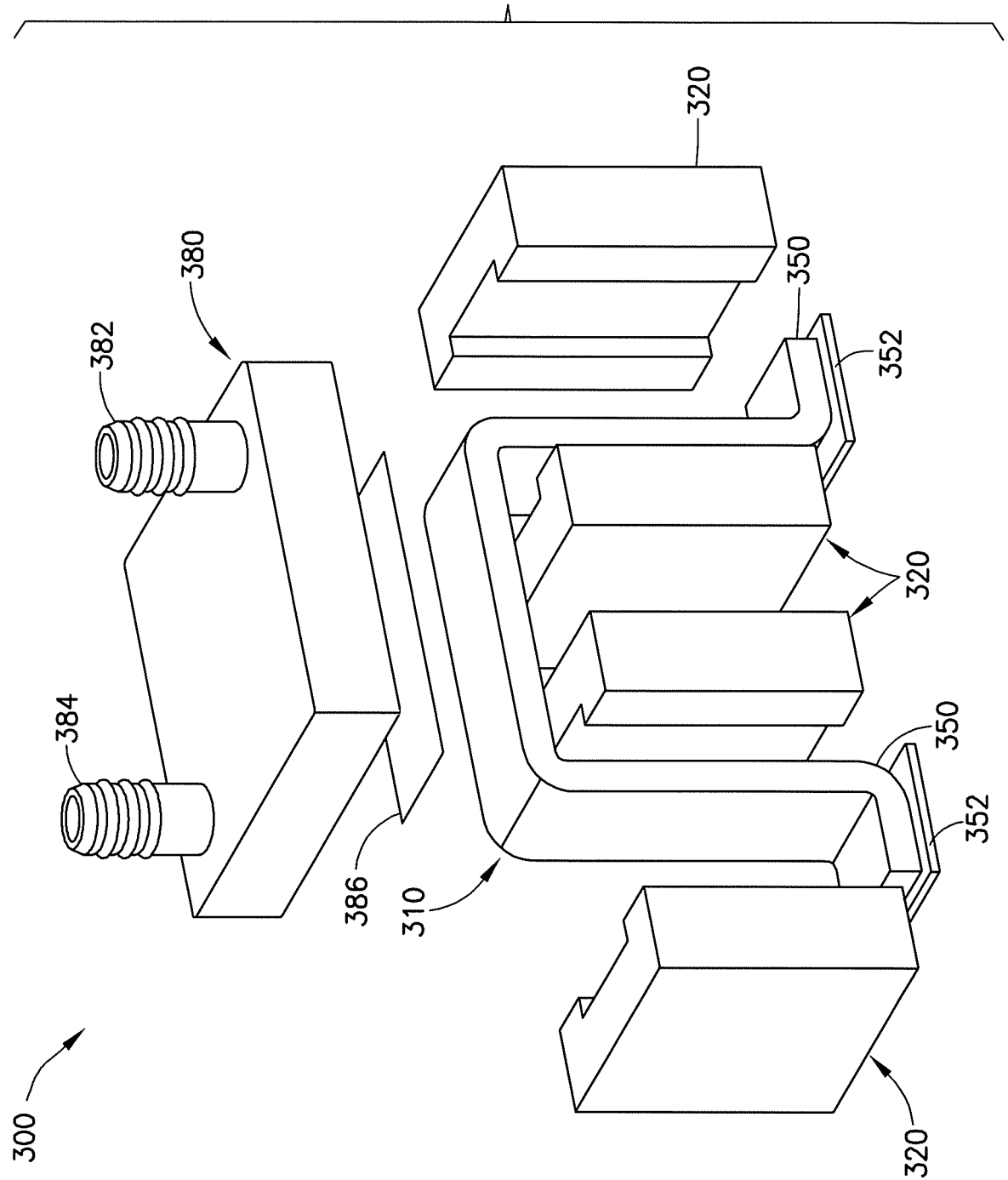
FIG. 3A is an exploded perspective view of an inductor having four magnetic cores and a cold plate.
Figure 3B:
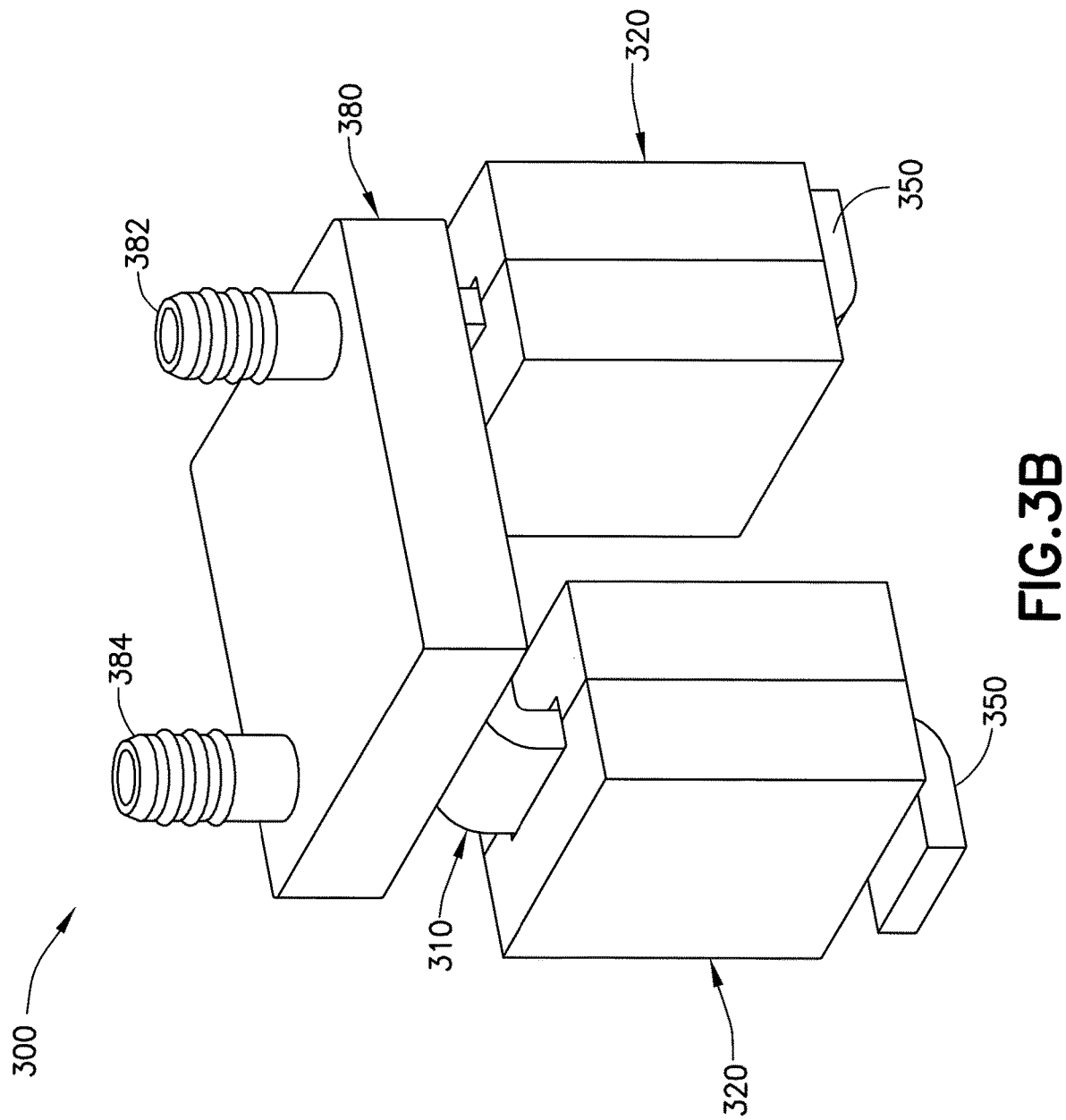
FIG. 3B is a perspective view of the inductor of FIG. 3A showing the magnetic cores closed around the conductor and the cold plate positioned on the conductor.
Figure 3C:
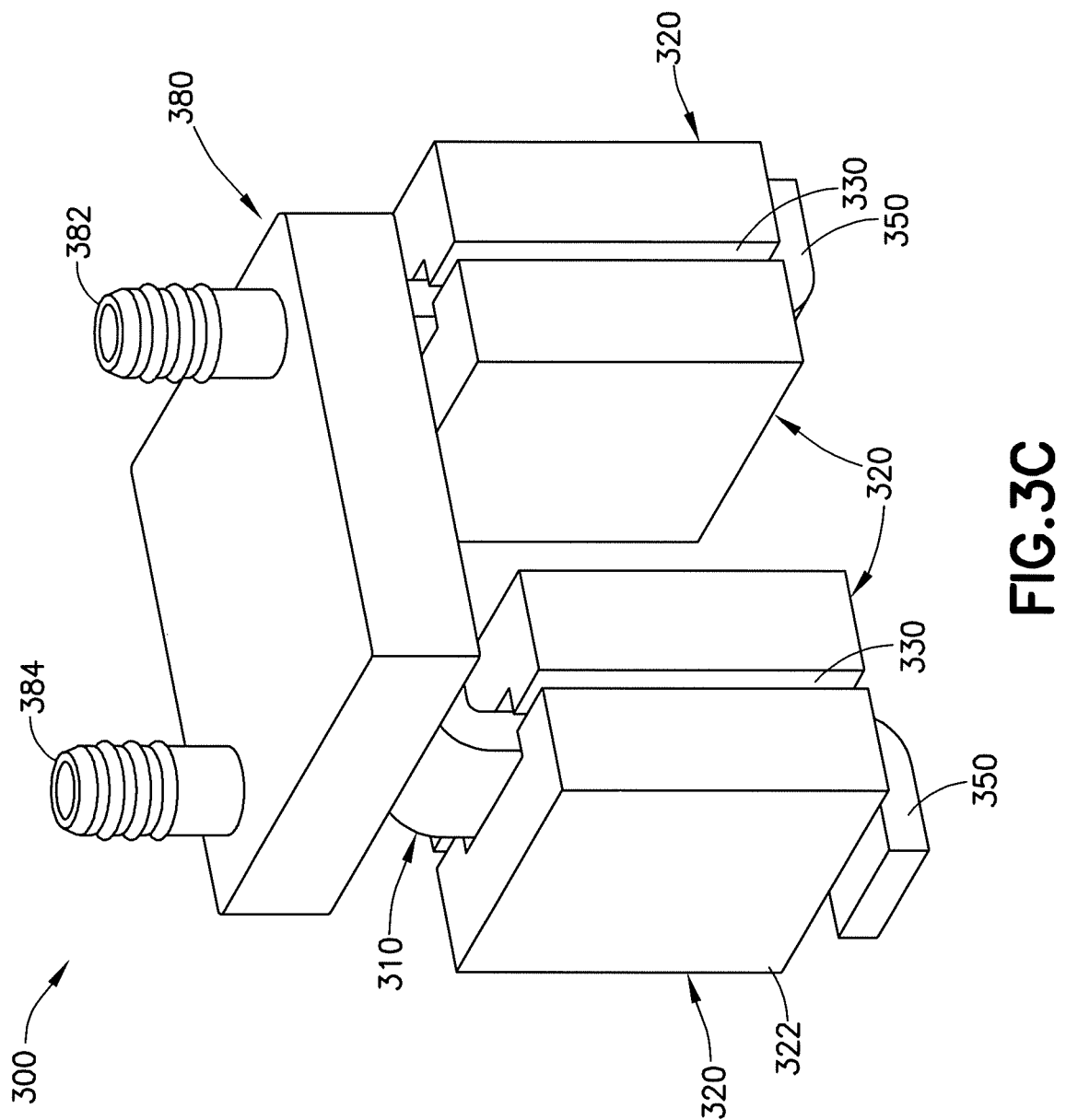
FIG. 3C is a perspective view of the inductor of FIG. 3A in which the magnetic cores, when coupled to the conductor, include longitudinal gaps.

Referring to FIGS. 3A-3C, another exemplary embodiment of an inductor structure having improved thermal conductivity is shown generally at 300 and is hereinafter referred to as "inductor 300." Inductor 300 is similar to inductor 100 and includes a conductor 310 and magnetic core(s) 320, but inductor 300 includes a cooling element in the form of a cold plate 380 for dispersing heat from (1) the conductor 310, (2) semiconductors devices or other circuit board components proximate the inductor 300, and/or (3) a circuit board onto which the inductor 300 is mounted (e.g., by soldering or the like). The conductor 310 may have feet 350 that are mounted on pads 352.

As shown in FIG. 3A, the cold plate 380 is a container having an inlet 382 and an outlet 384 through which a fluid (a gas or a liquid, such as water) may be caused to flow. A surface of the cold plate 380 may be disposed on the conductor 310 through a thermal interface material 386. As with the inductor 200, the thermal interface material 386 may comprise any suitable material (as indicated above) capable of facilitating effective thermal contact between the cold plate 380 and the conductor 310. In some embodiments, however, the cold plate 380 may be an integrated unit with the conductor 310.

As shown in FIG. 3B, the cold plate 380 is mounted on a portion of the conductor 310 exposed outside the magnetic region. As shown, the portion of the conductor 310 exposed outside the magnetic region is intermediate the magnetic cores 320. As shown in FIG. 3C, two magnetic cores 320 may be coupled around the conductor 320 so as to form gaps 330 extending lengthwise along the magnetic cores 320. The gaps 330 may help to mitigate magnetic flux saturation in the inductor 300.

Figure 4A:
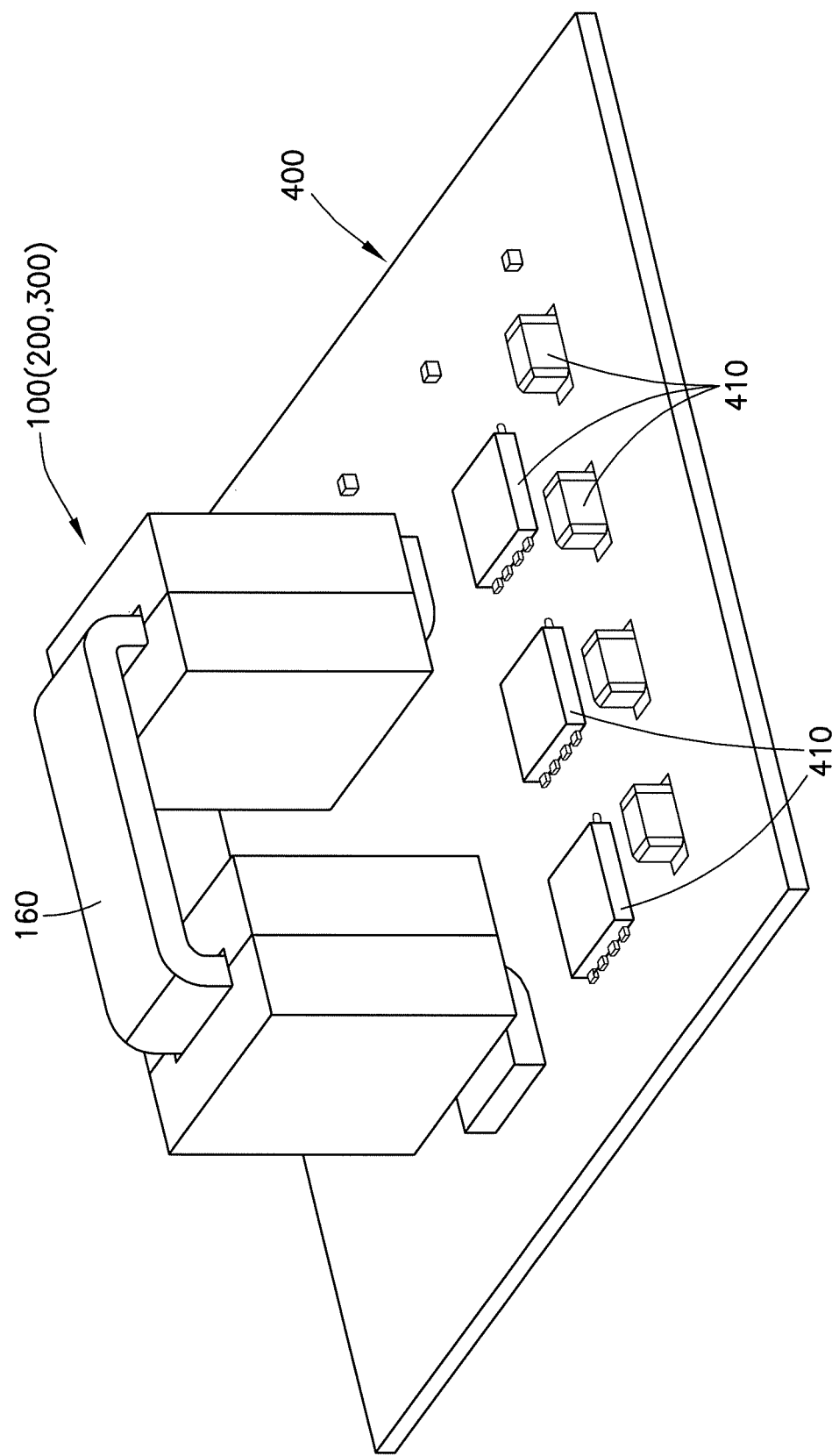
FIG. 4A is a perspective view of a circuit board on which the inductor of FIG. 1B is mounted.

Referring to FIG. 4A, one exemplary embodiment of a circuit board on which the inductor 100 may be mounted is shown generally at 400. As shown, one or more inductors 100 may be mounted on a surface of the circuit board 400 proximate electrical components 410 (or any semiconductor device). The feet 150 of the inductors 100 may be mounted on the conductive pads 152 on the surface of the circuit board 400 using any suitable means (e.g., soldering or the like). Heat generated from the electrical components 410 is generally transferred to the conductors 110 and to the upper lengths 160 where it is dissipated to the atmosphere. Although the inductors 100 are shown without heat sinks 280 or cold plates 380, such elements may be incorporated into the inductors (such that the circuit board 400 may employ inductors 200 or inductors 300).

Figure 4B:
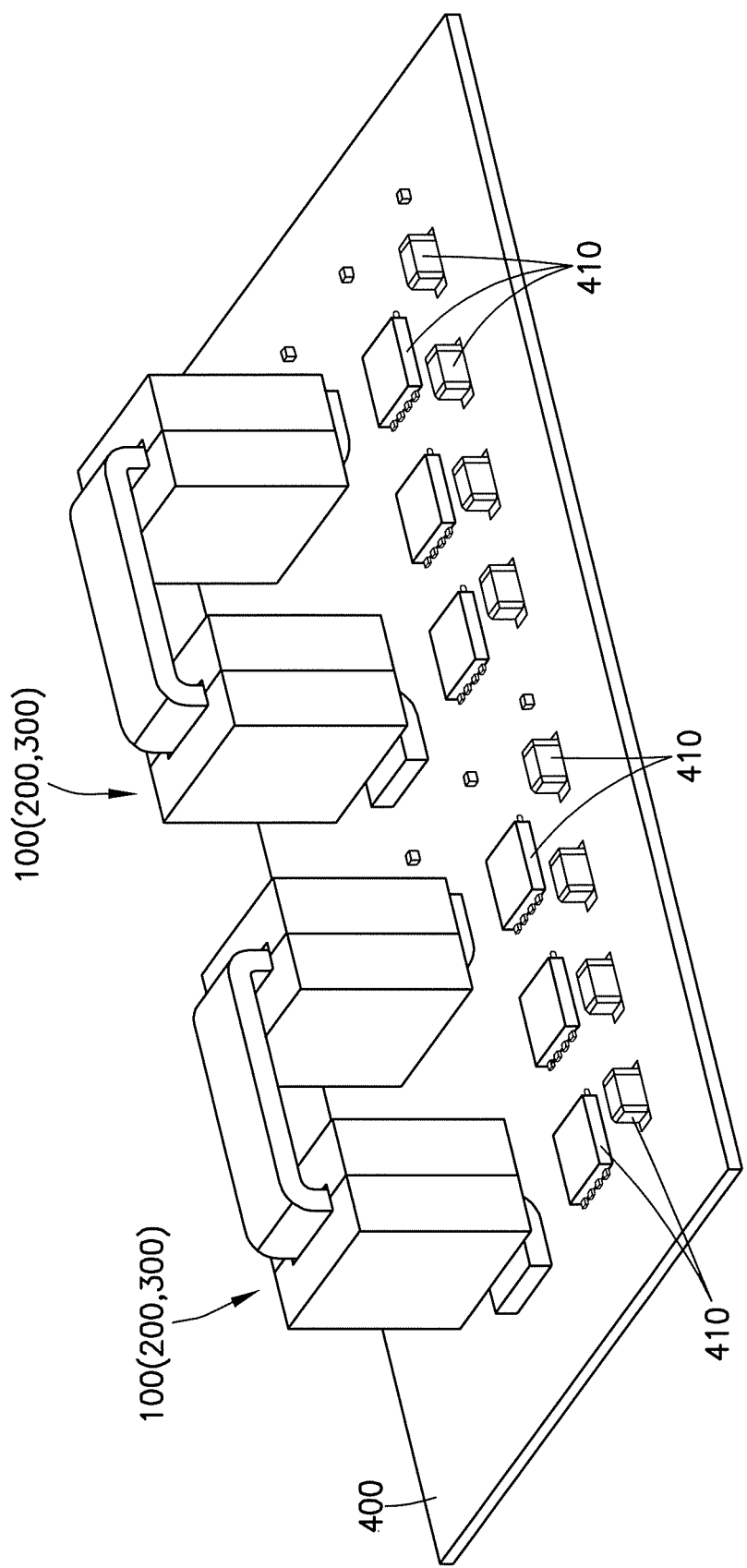
FIG. 4B is a perspective view of a circuit board on which two inductors are mounted.

Referring to FIG. 4B, two or more inductors 100 (or inductors 200, 300) may be mounted to the circuit board 400.

The inductors 100, 200, 300 as proposed herein may address problems associated with the cooling of circuit board components having shorter profiles. In particular, air cooling such components using techniques of the prior art may have limited efficacy. The inductors 100, 200, 300 as proposed herein overcome the problems of the prior art techniques by providing improved thermal conductivity over an overall height of an inductor 100, 200, 300, e.g., from the feet 150 to the upper length 160 (as in inductor 100), which permits improved contact to a heat sink 280 or cold plate 380 (in exemplary embodiments in which the heat sink 280 or cold plate 380 is employed). The heat generated from the inductor 100 itself, from the electrical components around the inductor 100, and from the circuit board 400 onto which the inductor 100 is mounted will be removed more effectively.

In one example, an inductor comprises a conductor having a first end and a second end, wherein the first end, the second end, or both ends are configured to be mounted on a substrate and configured to receive a heat flow; and one or more magnetic cores surrounding a first portion of the conductor, the first portion of the conductor being intermediate the first end and the second end of the conductor. A second portion of the conductor not surrounded by the one or more magnetic cores is configured to transfer the heat flow from the conductor.

One or more of the magnetic cores may comprise a recessed portion configured to accommodate the conductor therein, when two or more magnetic cores are coupled together around the conductor. The two or more magnetic cores may be configured to be coupled around the conductor to form one or more gaps between the magnetic cores. The inductor may further comprise a heat sink disposed on the second portion of the conductor not surrounded by the one or more magnetic cores to transfer the heat flow from the conductor. The heat sink may comprise a planar base coupled to the second portion of the conductor and at least one fin extending substantially perpendicularly from the planar base. The inductor may further comprise a thermal interface material between the heat sink and the conductor. The heat sink may be integrated with the second portion of the conductor. The inductor may further comprise a cold plate disposed on the second portion of the conductor not surrounded by the one or more magnetic cores to transfer the heat flow from the conductor. The cold plate may comprise a container having an inlet and an outlet through which a fluid may flow. The inductor may further comprise a thermal interface material between the cold plate and the conductor. The cold plate may be integrated with the second portion of the conductor.

In another example, an inductor comprises a conductive winding, the conductive winding comprising an elongated member having a first end and a second end through which electrical current can flow; and one or more magnetic cores enclosing a portion of the conductive winding. A portion of the conductive winding not enclosed by the one or more magnetic cores is configured to conduct heat away from the conductive winding.

The inductor may further comprise conductive pads on the first end of the elongated member and the second end of the elongated member, one or both of the conductive pads being configured to receive heat from an electrical component. The inductor may further comprise a heat mitigating element disposed on the portion of the conductive winding not enclosed by the one or more magnetic cores. The heat mitigating element may be a heat sink or a cold plate. The inductor may further comprise a thermal interface material between the heat mitigating element and the conductive winding.

In another example, a method comprises providing a conductor through a magnetic core, the conductor having a first end and a second end, the first end and the second end configured to be mounted on a substrate, and the magnetic core surrounding a first portion of the conductor, the first portion of the conductor being intermediate the first end and the second end of the conductor; conducting current through the conductor with an inductance created by a current loop and the magnetic core; conducting heat to the conductor; and transferring the heat away from the conductor.

Transferring the heat away from the conductor may comprise transferring the heat to a heat sink. Transferring the heat away from the conductor may comprise transferring the heat to a cold plate.

In the foregoing description, numerous specific details are set forth, such as particular structures, components, materials, dimensions, process or method steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or process or method steps may have been omitted or may have not been described in order to avoid obscuring the presented embodiments.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An inductor, comprising:
a conductor having a first end and a second end, wherein the first end, the second end, or both ends are configured to be mounted on a substrate and configured to receive a heat flow;
one or more magnetic cores surrounding a length of, forming a closed loop around, and being in continuous contact with a first portion of the conductor, the first portion of the conductor being intermediate the first end and the second end of the conductor;
wherein a second portion of the conductor not surrounded by the one or more magnetic cores is configured to transfer the heat flow from the conductor.

2. The inductor of claim 1, wherein one or more magnetic cores comprises a recessed portion configured to accommodate the conductor therein, when two or more magnetic cores are coupled together around the conductor.

3. The inductor of claim 2, wherein the two or more magnetic cores are configured to be coupled around the conductor to form one or more gaps between the magnetic cores.

4. The inductor of claim 1, further comprising a heat sink disposed on the second portion of the conductor not surrounded by the one or more magnetic cores to transfer the heat flow from the conductor.

5. The inductor of claim 4, wherein the heat sink comprises a planar base coupled to the second portion of the conductor and at least one fin extending substantially perpendicularly from the planar base.

6. The inductor of claim 4, further comprising a thermal interface material between the heat sink and the conductor.

7. The inductor of claim 4, wherein the heat sink is integrated with the second portion of the conductor.

8. The inductor of claim 1, further comprising a cold plate disposed on the second portion of the conductor not surrounded by the one or more magnetic cores to transfer the heat flow from the conductor.

9. The inductor of claim 8, wherein the cold plate comprises a container having an inlet and an outlet through which a fluid may flow.

10. The inductor of claim 8, further comprising a thermal interface material between the cold plate and the conductor.

11. The inductor of claim 8, wherein the cold plate is integrated with the second portion of the conductor.

12. An inductor, comprising:
a conductive winding, the conductive winding comprising an elongated member having a first end and a second end through which electrical current can flow;
one or more magnetic cores surrounding a length of, forming a closed loop around, and being in continuous contact with a portion of the conductive winding;
wherein a portion of the conductive winding not enclosed by the one or more magnetic cores is configured to conduct heat away from the conductive winding.

13. The inductor of claim 12, further comprising conductive pads on the first end of the elongated member and the second end of the elongated member, one or both of the conductive pads being configured to receive heat from an electrical component.

14. The inductor of claim 12, further comprising a heat mitigating element disposed on the portion of the conductive winding not enclosed by the one or more magnetic cores.

15. The inductor of claim 14, wherein the heat mitigating element is a heat sink.

16. The inductor of claim 14, wherein the heat mitigating element is a cold plate.

17. The inductor of claim 14, further comprising a thermal interface material between the heat mitigating element and the conductive winding.

18. A method, comprising:
providing a conductor through a magnetic core, the conductor having a first end and a second end, the first end and the second end configured to be mounted on a substrate, and the magnetic core surrounding a length of, forming a closed loop around, and being in continuous contact with a first portion of the conductor, the first portion of the conductor being intermediate the first end and the second end of the conductor;
conducting current through the conductor with an inductance created by a current loop and the magnetic core;
conducting heat to the conductor; and
transferring the heat away from the conductor.

19. The method of claim 18, wherein transferring the heat away from the conductor comprises transferring the heat to a heat sink.

20. The method of claim 18, wherein transferring the heat away from the conductor comprises transferring the heat to a cold plate.

* * * * *